(12) United States Patent
Hung et al.

(10) Patent No.: US 8,459,343 B2
(45) Date of Patent: Jun. 11, 2013

(54) THERMAL MODULE ASSEMBLY AND HEAT SINK ASSEMBLY HAVING AT LEAST TWO ENGAGEABLE HEAT SINKS

(75) Inventors: Jui-Wen Hung, Taipei Hsien (TW); Ching-Bai Hwang, Taipei Hsien (TW); Jie Zhang, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 1317 days.

(21) Appl. No.: 12/099,171

(22) Filed: Apr. 8, 2008

(65) Prior Publication Data

US 2009/0229791 A1    Sep. 17, 2009

(30) Foreign Application Priority Data

Mar. 14, 2008    (CN) .......................... 2008 1 0065854

(51) Int. Cl.
*F28F 7/00*    (2006.01)
(52) U.S. Cl.
USPC ..................................... 165/185; 29/890.03
(58) Field of Classification Search
USPC .................. 165/185; 361/704, 709, 717, 718, 361/719; 29/890.03
See application file for complete search history.

(56) References Cited

U.S. PATENT DOCUMENTS

| | | | | |
|---|---|---|---|---|
| 2,434,676 A | * | 1/1948 | Spender | 165/182 |
| 3,220,471 A | * | 11/1965 | Coe | 165/185 |
| 3,312,277 A | * | 4/1967 | Chitouras et al. | 165/185 |
| 4,007,402 A | * | 2/1977 | Allport | 361/709 |
| 4,800,956 A | * | 1/1989 | Hamburgen | 165/185 |
| 5,014,776 A | * | 5/1991 | Hess | 165/185 |
| 5,042,257 A | * | 8/1991 | Kendrick et al. | 165/185 |
| 5,109,318 A | * | 4/1992 | Funari et al. | 257/718 |
| 5,184,281 A | * | 2/1993 | Samarov et al. | 165/185 |
| 5,227,663 A | * | 7/1993 | Patil et al. | 361/717 |
| 5,293,930 A | * | 3/1994 | Pitasi | 165/185 |
| 5,343,362 A | * | 8/1994 | Solberg | 165/185 |
| 5,419,041 A | * | 5/1995 | Ozeki | 29/890.03 |
| 6,009,938 A | * | 1/2000 | Smith et al. | 165/185 |
| 6,545,872 B1 | * | 4/2003 | Lonergan et al. | 361/719 |
| 7,104,311 B1 | * | 9/2006 | Teng | 361/704 |
| 7,284,597 B2 | * | 10/2007 | Tang | 361/704 |
| 7,457,122 B2 | | 11/2008 | Lai et al. | |
| 7,497,013 B2 | * | 3/2009 | Zaghlol | 165/185 |

(Continued)

FOREIGN PATENT DOCUMENTS

| CN | 101026945 A | 8/2007 |
|---|---|---|
| TW | 1263474 | 10/2006 |

*Primary Examiner* — Ljiljana Ciric
(74) *Attorney, Agent, or Firm* — Altis Law Group, Inc.

(57) ABSTRACT

A thermal module assembly includes a first thermal module (10) and a second thermal module (20). The first thermal module (10) has a fan (300) with an air outlet, a first heat sink (120) positioned at the air outlet and a first clamp portion (122) formed on the first heat sink (120). The second thermal module (20) has a second heat sink (220) and a second clamp portion (222) formed on the second heat sink (220). The second heat sink (220) is juxtaposed with the first heat sink (120). The first heat sink (120) and the second heat sink (220) are combined together via engagement of the first clamp portion (122) and the second clamp portion (222) so that airflow produced by the fan (300) flows past the first heat sink (120) and the second heat sink (220) in order.

4 Claims, 4 Drawing Sheets

U.S. PATENT DOCUMENTS

| | | | |
|---|---|---|---|
| 7,530,388 B2 * | 5/2009 | Luo et al. | 165/185 |
| 7,725,011 B2 * | 5/2010 | Boussier | 392/407 |
| 7,819,173 B2 * | 10/2010 | Zaghlol | 361/704 |
| 2004/0150955 A1 * | 8/2004 | Lin | 361/709 |

* cited by examiner

THERMAL MODULE ASSEMBLY AND HEAT SINK ASSEMBLY HAVING AT LEAST TWO ENGAGEABLE HEAT SINKS

BACKGROUND

1. Technical Field

The present invention generally relates to a thermal module assembly and a heat sink assembly thereof. Particularly, the present invention relates to a thermal module assembly used in a laptop computer. The thermal module assembly has heat sinks for dissipating heat generated by different components, and the heat sinks are connected with each other.

2. Description of Related Art

With increasing performance of CPU, graphic chips and other components in computers, a plurality of thermal modules are used in a computer to cool the CPU, graphic chips and other components respectively. For example, a first thermal module has a fan and a first heat sink in thermal engagement with a CPU, and a second thermal module has a second heat sink and a heat pipe extending from a graphic chip up to the second heat sink.

The first and second heat sinks are usually juxtaposed corresponding to an air outlet of the fan when the space limitations in the computer and the cost of the thermal modules are taken into consideration. By such design, the first and second heat sinks are cooled by the same fan; this not only makes the thermal modules compact, but also reduces the cost of the thermal modules compared to that each of the first and second heat sinks is equipped with a fan.

However, the heat pipe is easy to be deformed since the weight of the second heat sink is usually supported only by the heat pipe and the heat pipe has to travel a long distance from the graphic chip to the second heat sink to aim the second heat sink at the air outlet of the fan. Particularly, when the second thermal module works for a long time under a condition of vibration or the computer falls to the ground, the heat pipe may have a large deformation. Then, the second heat sink may shift from the air outlet of the fan due to the large deformation of the heat pipe. As a result, the second heat sink can not make full use of airflow produced by the fan, and the heat dissipation capability of the second thermal module is greatly decreased.

Therefore, there is a need for a thermal module assembly, which can overcome above problems.

SUMMARY

The present invention provides a thermal module assembly. The thermal module assembly comprises a first thermal module and a second thermal module. The first thermal module has a fan with an air outlet and a first heat sink positioned at the air outlet of the fan. The first thermal module further has a first clamp portion formed on the first heat sink. The second thermal module has a second heat sink and a second clamp portion formed on the second heat sink. The second heat sink is juxtaposed with the first heat sink. The first heat sink and the second heat sink are combined together via engagement of the first clamp portion and the second clamp portion so that airflow produced by the fan flows past the first heat sink and the second heat sink in order.

The present invention also provides a heat sink assembly. The heat sink assembly has a first heat sink with a first clamp portion and a second heat sink with a second clamp portion corresponding to the first clamp portion. The first heat sink and the second heat sink are combined together via engagement of the first clamp portion and the second clamp portion.

Other advantages and novel features of the present invention will become more apparent from the following detailed description of preferred embodiments when taken in conjunction with the accompanying drawings, in which:

DETAILED DESCRIPTION

Figure 1:
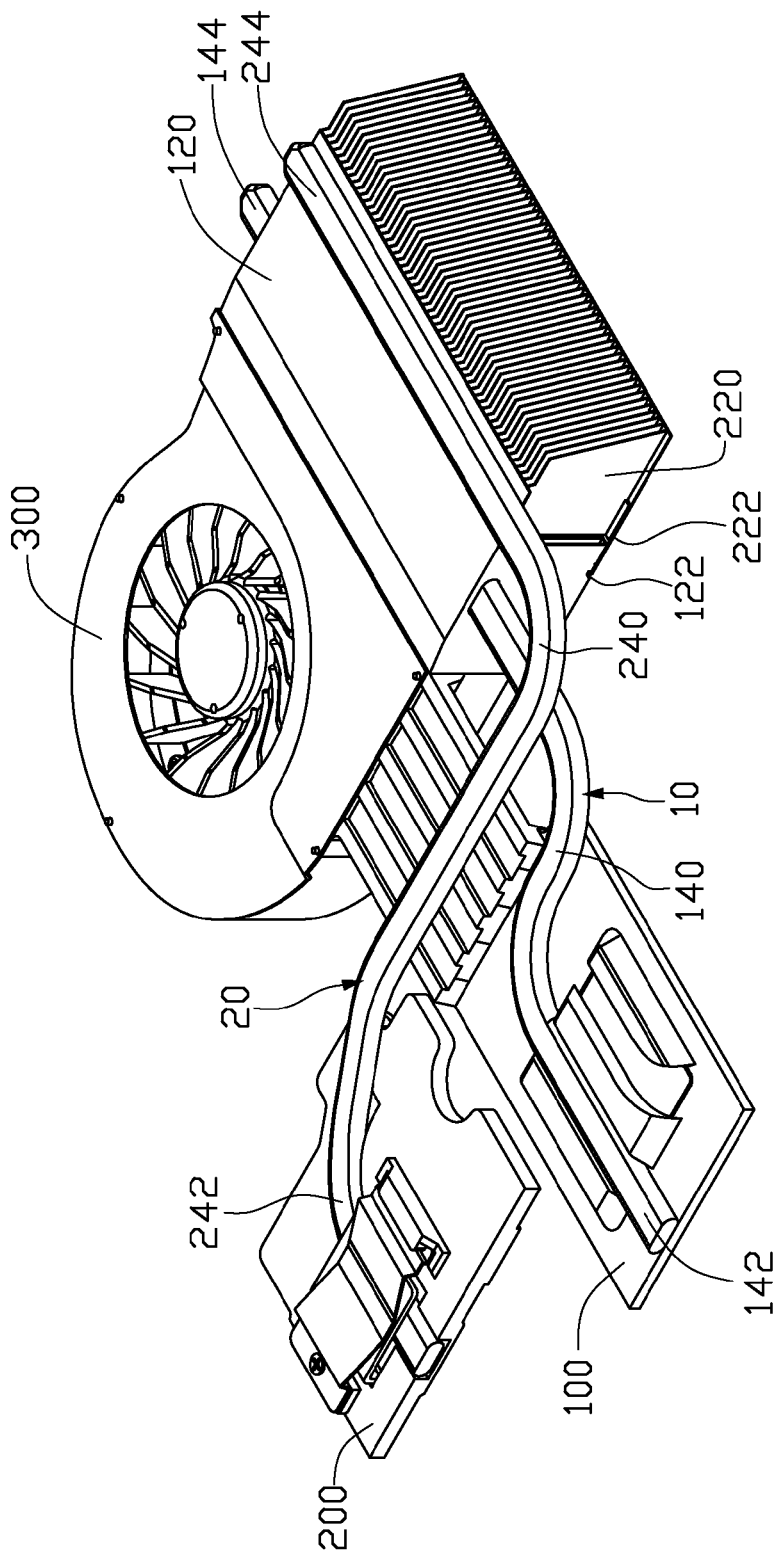
FIG. 1 is an isometric view of a thermal module assembly in accordance with a preferred embodiment of the present invention.
Figure 2:
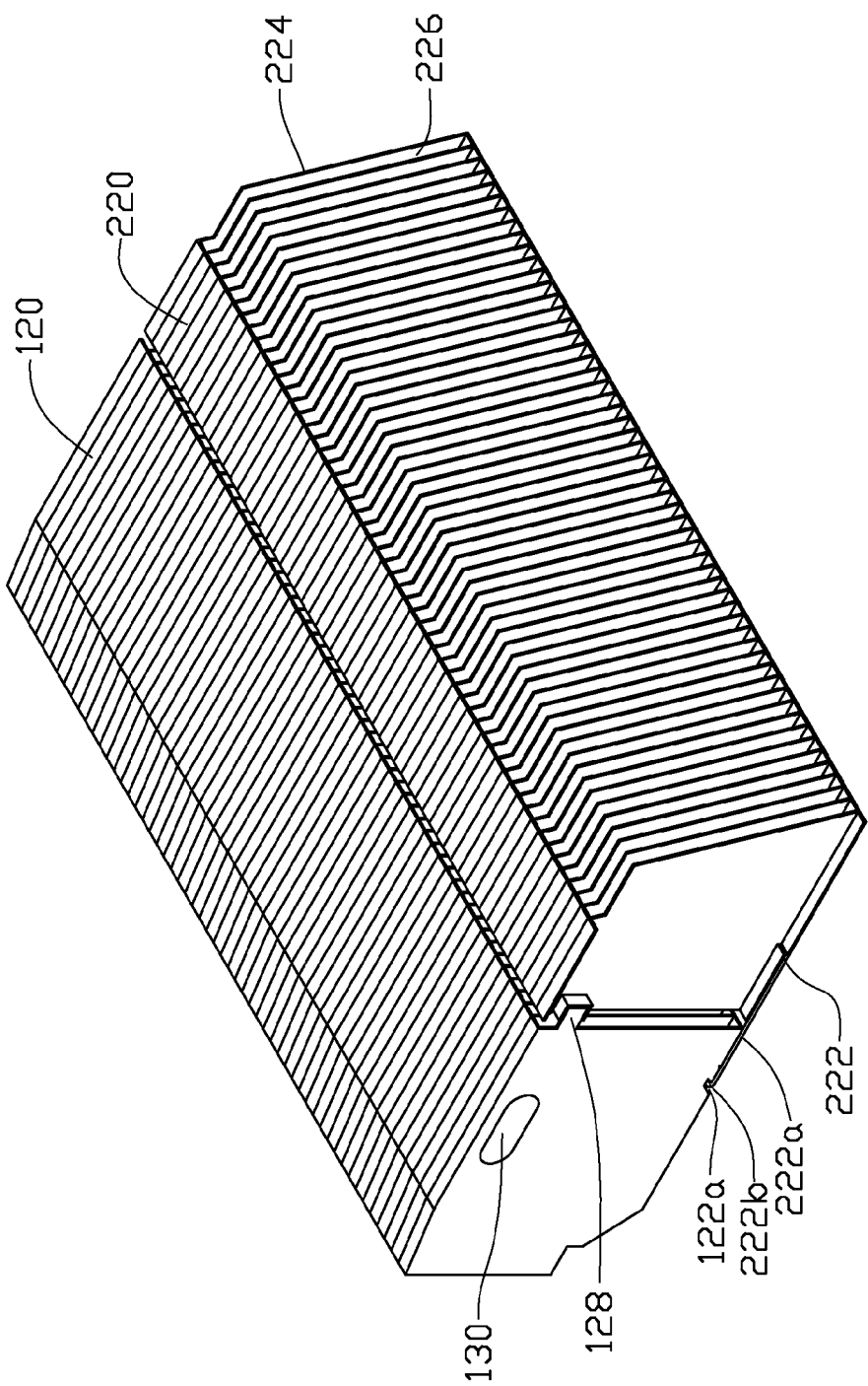
FIG. 2 is an enlarged isometric view of a heat sink assembly of the thermal module assembly of FIG. 1.
Figure 3:
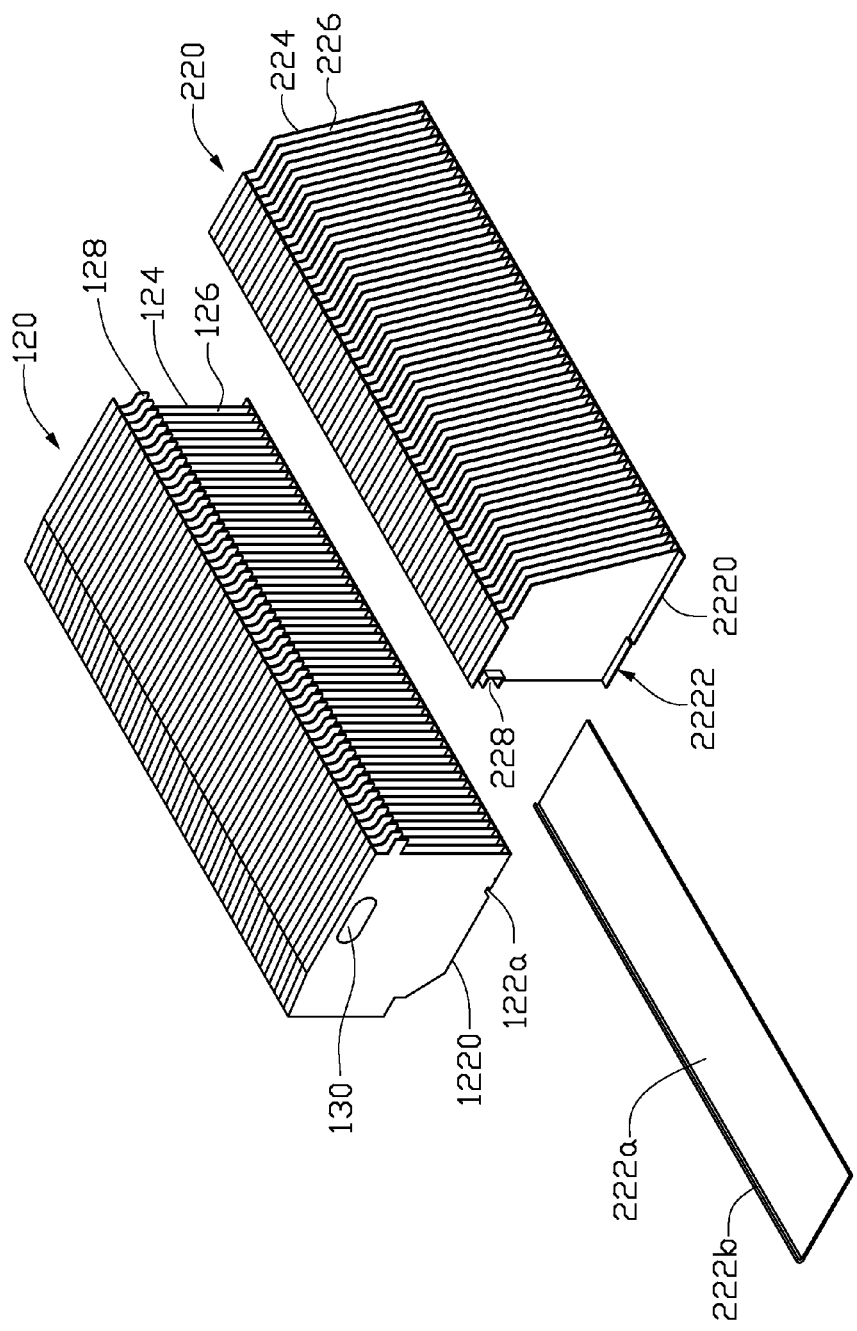
FIG. 3 is an exploded view of the heat sink assembly of FIG. 2.

Reference will now be made to the drawing figures to describe the preferred embodiment in detail.

The present embodiment provides a thermal module assembly for use particularly in a notebook computer. Referring to FIGS. 1-4, the thermal module assembly comprises a first thermal module 10 and a second thermal module 20.

The first thermal module 10 comprises a first heat-absorbing member 100, a first heat pipe 140, a fan 300 with an air outlet and a first heat sink 120 positioned at the air outlet of the fan 300. The first heat-absorbing member 100 is used to contact with a first heat source such as a CPU and absorb heat produced by the CPU. The first heat pipe 140 comprises an evaporator 142 contacting with the first heat-absorbing member 100 and a condenser 144 received in a through hole 130 of the first heat sink 120. The first heat pipe 140 transfers heat of the heat-absorbing member 100 to the first heat sink 120, which is cooled by the airflow discharged from the air outlet of the fan 300. The first thermal module 10 further comprises a first clamp portion 122 formed on the first heat sink 120.

The second thermal module 20 comprises a second heat-absorbing member 200, a second heat pipe 240 and a second heat sink 220 juxtaposed with the first heat sink 120, in which the first heat sink 120 is located between the air outlet of the fan 300 and the second heat sink 220. The air generated by the fan 300 first flows through the first heat sink 120 and then through the second heat sink 220. The second heat pipe 240 comprises an evaporator 242 contacting with the second heat-absorbing member 200 and a condenser 244 contacting with the second heat sink 220. The second heat absorbing-member 200 is used to contact with a second heat source such as a graphic chip and absorb heat produced by the graphic chip. The second heat pipe 240 transfers heat of the second heat-absorbing member 200 to the second heat sink 220, which is also cooled by the airflow discharged from the air outlet of the fan 300.

The second thermal module 20 further comprises a second clamp portion 222 formed on the second heat sink 220. The second heat sink 220 and the first heat sink 120 are combined together via engagement of the first clamp portion 122 and the second clamp portion 222. When the first heat sink 120 and the second heat sink 220 are combined together, the first heat sink 120 and the second heat sink 220 are arranged in a line corresponding to the air outlet of the fan 300 so that the airflow discharged from the air outlet of the fan 300 flows past the first heat sink 120 and the second heat sink 220 in order. Thus, the first heat sink 120 and the second heat sink 220 can be cooled by the same fan 300; this not only makes the thermal module assembly compact, but also reduces the cost of the thermal module assembly compared to that each of the first and second heat sinks 120, 220 is equipped with a fan.

Furthermore, since the first heat sink 120 and the second heat sink 220 are assembled together via engagement of the first clamp portion 122 and the second clamp portion 222, the second heat sink 220 will not be easily deviated from the air outlet of the fan 300 even though the second heat pipe 240 is deformed due to a long-time vibration thereto or a fall of the notebook computer to the ground. This ensures that the first heat sink 120 and the second heat sink 220 can make good use of the airflow from the fan 300.

Moreover, since the first heat sink 120 and the second heat sink 220 are assembled together, the weight of the second heat sink 220 is also supported by the first heat sink 120, in addition to the second heat pipe 240, in which the first sink 120 may be fixed on a printed circuit board or a computer case. Accordingly, the second heat pipe 240 needs not to support all of the weight of the second heat sink 220; thus, the second heat pipe 240 is not easy to be deformed and this ensures that the second heat pipe 240 can always have a high heat transfer capability.

As mentioned above, by the presence of the first clamp portion 122 and the second clamp portion 222, the problems of the conventional thermal module can be overcome. The detailed structures of the first clamp portion 122 and the second clamp portion 222 will be described in the following text.

Figure 4:
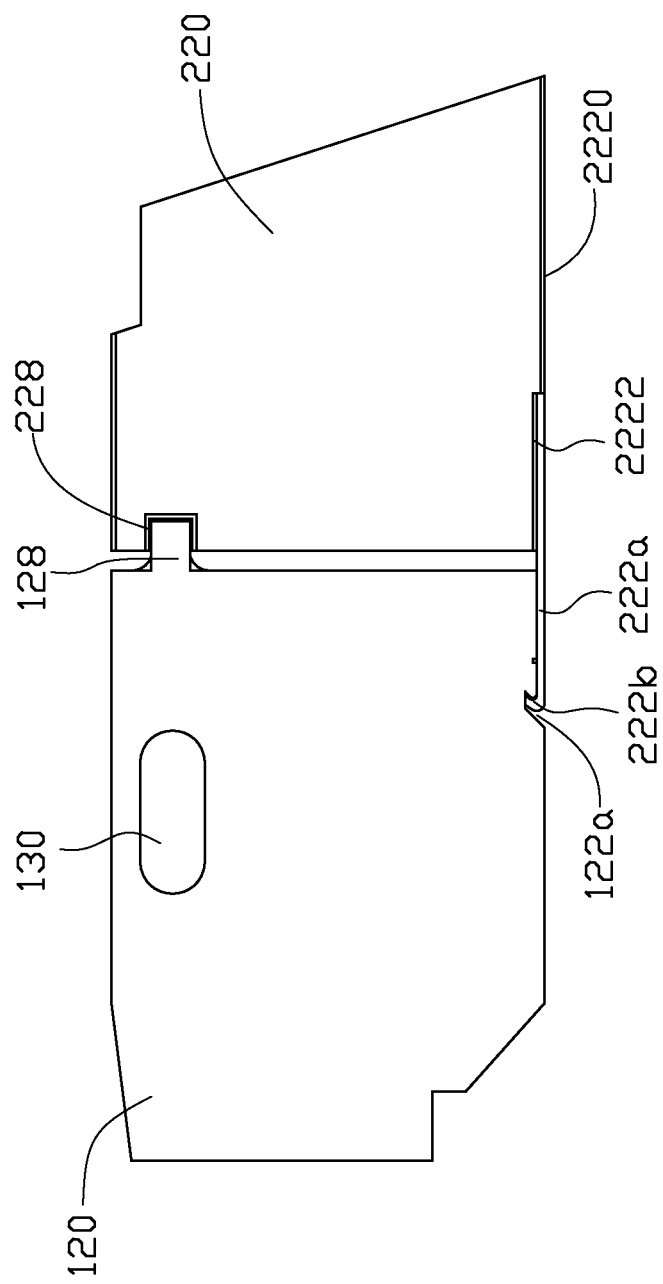
FIG. 4 is a side elevational view of the heat sink assembly of FIG. 2.

The first heat sink 120 comprises a plurality of first fins 124 and a plurality of first passages 126 defined between adjacent first fins 124. The first clamp portion 122 comprises a groove 122a defined in a bottom portion 1220 of the first heat sink 120. The groove 122a extends in a direction perpendicular to that of the first fins 124. The groove 122a divides the bottom portion 1220 of the first heat sink 120 into two parts, namely a first part near the second heat sink 220, and a second part away from the second heat sink 220. The second part is lower than the first part when the first heat sink 120 is horizontally arranged as shown in FIG. 4.

The second heat sink 220 comprises a plurality of second fins 224 and a plurality of second passages 226 defined between adjacent second fins 224. The second fins 224 are parallel to the first fins 124 so that the first passages 126 and the second passages 226 are communicated. The second clamp portion 222 comprises a rectangular-shape connecting board 222a mounted on a bottom portion 2220 of the second heat sink 220.

The connecting board 222a has a first portion firmly attached to the bottom portion 2220 of the second heat sink 220 by soldering and a second portion located under a bottom surface of the first part of the first heat sink 120. A hook portion 222b is formed on an edge of the second portion of the connecting board 222a and corresponding to the groove 122a. The hook portion 222b engages with the groove 122a so that the first heat sink 120 and the second heat sink 220 are combined together.

In other words, when the first heat sink 120 and the second heat 220 are juxtaposed with each other, the connecting board 222a extends from the bottom portion 2220 of the second heat sink 220 to the first part of the bottom portion 1220 of the first heat sink 120, and the hook portion 222b is tightly fitted into the groove 122a.

Preferably, a recess 2222 may be defined in a bottom portion 2220 of the second heat sink 220 adjacent to the first heat sink 120. The recess 2222 is used to receive the first portion of the connecting board 222a. Therefore, when the hook 222b engages in the groove 122a, a bottom surface of the connecting board 222a, the bottom surface of the first heat sink 120 and a bottom surface of the second heat sink 220 lie in a common surface except parts of the bottom surfaces of the first heat sink 120 and the second heat sink 220 covered by the connecting board 222a. In other words, a heat sink assembly consisting of the first heat sink 120, the second heat sink 220 and the connecting board 222a has a planar bottom surface.

In order to make sure that the first heat sink 120 and the second heat sink 220 are firmly connected together, a protrusion 128 is formed on a side of the first heat sink 120 facing the second heat sink 220, and a channel 228 is defined in a side of the second heat sink 220 facing the first heat sink 120. The protrusion 128 extends from the first heat sink 120 towards the channel 228 of the second heat sink 220. When the first heat sink 120 and the second heat sink 220 are juxtaposed with each other, the protrusion 128 is inserted into the channel 228 and is tightly retained in the channel 228. Therefore, the first heat sink 120 and the second heat sink 220 are firmly combined together via the engagement of the groove 122a and the hook 222b and the engagement of the protrusion 128 and the channel 228. It can be understood that the first heat sink 120 and the second heat sink 220 can be firmly combined together via the engagement of the protrusion 128 and the channel 228 alone. In this regard, the protrusion 128 is the first clamp portion and the channel 228 is the second clamp portion.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
a first heat sink with a first clamp portion; and
a second heat sink with a second clamp portion corresponding to the first clamp portion;
wherein the first heat sink and the second heat sink are combined together via engagement of the first clamp portion and the second clamp portion;
wherein the first clamp portion comprises a groove defined in the first heat sink, the second clamp portion comprises a connecting board with a hook vertically formed on the connecting board, the connecting board extends from the second heat sink towards the first heat sink, and the hook engages in the groove of the first heat sink;
wherein the second heat sink has a recess, the recess is defined in a bottom portion of the second heat sink adjacent to the first heat sink, and the connecting board is partly received in the recess; and
wherein a bottom surface of the connecting board, a bottom surface of the first heat sink and a bottom surface of the second heat sink lie in a common plane.

2. The heat sink assembly of claim 1, wherein the first heat sink and the second heat sink are detachably combined together via engagement of the first clamp portion and the second clamp portion.

3. The heat sink assembly of claim 1, wherein a protrusion is formed on a side of the first heat sink facing the second heat sink, a channel is defined in a side of the second heat sink facing the first heat sink, and the protrusion is retained in the channel.

4. The heat sink assembly of claim 1, wherein the first clamp portion comprises a protrusion formed on a side of the first heat sink facing the second heat sink, the second clamp portion comprises a channel defined in a side of the second heat sink facing the first heat sink, and the protrusion is retained in the channel.

* * * * *